United States Patent
Matsunaga et al.

[11] Patent Number: 6,074,768
[45] Date of Patent: Jun. 13, 2000

[54] PROCESS FOR FORMING THE OXIDE SUPERCONDUCTOR THIN FILM AND LAMINATE OF THE OXIDE SUPERCONDUCTOR THIN FILMS

[75] Inventors: Yoshinori Matsunaga; Shuichi Fujino; Akihiro Odagawa; Youichi Enomoto, all of Tokyo, Japan

[73] Assignee: Kyocera Corporation, Tokyo, Japan

[21] Appl. No.: 09/212,721

[22] Filed: Dec. 16, 1998

Related U.S. Application Data

[62] Division of application No. 08/880,914, Jun. 23, 1997, Pat. No. 5,885,939.

[30] Foreign Application Priority Data

Mar. 25, 1994 [JP] Japan .................................. 6-56221

[51] Int. Cl.⁷ .............................. B32B 9/00; B32B 12/00
[52] U.S. Cl. .......................... 428/700; 428/701; 428/702; 428/930; 505/237; 505/238
[58] Field of Search ................... 428/700–702, 428/930; 257/31, 36; 505/237, 238, 329, 472, 474, 475, 500

[56] References Cited

U.S. PATENT DOCUMENTS

| | | | |
|---|---|---|---|
| 5,413,988 | 5/1995 | Hayashi et al. | 505/511 |
| 5,428,005 | 6/1995 | Matsuura | 505/234 |

OTHER PUBLICATIONS

Bourdillon et al., "High Temperature Superconductors, Processing and Science," Academic Press, Inc. (San Diego, CA) 1994, pp. 42–44.
Cheung et al., Applied Physics Letters 60(25) Jun. 1992, pp. 3180–3182.
Hsieh et al., Thin Solid Films, 216(1992), pp. 28–32.
Singh et al., J. Applied Physics 67(8), Apr. 1990, pp. 3785–3790.
Current State of High Temperature Superconductive Electronic Devices, by Susumu Takada, Applied Physics, vol. 62, No. 5, 1993, pp. 443–454.

Primary Examiner—Timothy M. Speer
Assistant Examiner—Bryant Young
Attorney, Agent, or Firm—Loeb & Loeb, LLP

[57] ABSTRACT

A process for forming a laminate of 123-type copper oxide superconductor thin films having dissimilar crystal axis orientations, a laminate of 123-type thin copper oxide superconductor layers exhibiting excellent superconducting property, and wiring for Josephson junction. A c-axis oriented single crystalline thin film of an oxide superconductor having a Y:Ba:Cu atomic ratio of substantially 1:2:3 and a lattice constant of 11.60 angstroms $\leq c \leq$ 11.70 angstroms at a temperature of 20° C. under an oxygen partial pressure of 160 Torr is formed on a single crystalline substrate, and an a-axis oriented single crystalline thin film of said oxide superconductor is formed on the above laminated film relying upon a sputter deposition method.

4 Claims, 10 Drawing Sheets

RF MAGNETRON SPUTTERING APPARATUS

TEMPERATURE DEPENDENCY OF Ic

PROCESS FOR FORMING THE OXIDE SUPERCONDUCTOR THIN FILM AND LAMINATE OF THE OXIDE SUPERCONDUCTOR THIN FILMS

This is a division of application Ser. No. 08/880,914 filed Jun. 23, 1997, U.S. Pat. No. 5,885,939 which application is hereby incorporated by reference in its entirety.

BACKGROUND OF THE INVENTION

1. Field of the Invention

The present invention relates to a process for forming an oxide superconductor thin film and a laminate of oxide superconductor thin films that can be used for electronic elements.

2. Description of the Prior Art

As an oxide superconductor, there has heretofore been known a copper oxide superconductor (generally called 123-type copper superconductor) having the formula $YBa_2Cu_3O_{7-x}$ and an atomic ratio Y:Ba:Cu of substantially 1:2:3. This oxide superconductor has a layered crystal structure and exhibits strong anisotropic electric conduction property, and it has been desired to develop technology for uniformalizing axis orientations of crystals.

In preparing the junction, however, when the crystal axis orientations of an oxide superconductor thin film are all uniformalized, there no longer exists any interface, and neither a two-terminal element nor a three-terminal element can be realized with the thin film. To prepare a two-terminal element or a three-terminal element, therefore, a thin film of other material had to be laminated. In this lamination, however, the electric conduction in the interface of the laminate is subject to undergo a large change due to diffusion of atoms of different kinds, making it difficult to prepare ideal two-terminal element or three-terminal element.

It can therefore be contrived to prepare a two-terminal element or a three-terminal element in which the interface of the laminated layers is not changed by the diffusion of atoms of different kinds by utilizing strong anisotropy of the 123-type copper oxide superconductor and by laminating 123-type copper oxide superconductor thin films having dissimilar axis orientation as shown in FIG. 1.

The laminated layer structure of 123-type copper oxide superconductor thin films having dissimilar axis orientations has already been proposed in a "Report on the Study and Development of Large Current High Magnetic Field Superconductor Materials", International Superconductor Industries Technology Research Center Foundation, pp. 331–333. However, neither the conditions of lattice constants for laminating oxide superconductor thin films nor a suitable method of forming films has yet been known, and the above-mentioned two-terminal element or the three-terminal element has not been produced.

The laminated structure of 123-type copper oxide superconductor thin films having dissimilar axis orientations is also required for integrating the Josephson element. Among the 123-type copper oxide superconductor Josephson elements that have now been studied, the structure having a high degree of integration is a laminated structure. Among the elements of the laminated structure, the one that has a good Josephson junction is obtained by laminating a-axis oriented single crystalline thin films as disclosed in "Current State of High Temperature Superconductive Electronic devices" by Susumu Takada, Applied Physics, Vol. 62, No. 5, 1993, pp. 443–454. When the a-axis oriented single crystalline thin film is used as the Josephson element, however, a wiring must be formed by using the a-axis oriented single crystalline thin film having a low critical current Ic since the existing technology is capable of laminating films having the same axis orientation only. Accordingly, the wiring becomes too thick and the degree of integration cannot be so increased. In order to solve this problem, it becomes necessary to establish technology for laminating the a-axis oriented single crystalline thin film upon the c-axis oriented single crystalline thin film, in order to laminate an element of the a-axis oriented film that can be highly densely integrated on a wiring of the c-axis oriented single crystalline thin film that has a high critical current Ic and can be highly densely integrated.

It is not allowed to laminate 123-type copper oxide superconductor thin films having dissimilar crystal axis orientations because of the reasons described below.

What determines the crystal axis orientation of the thin film is the crystalline structure in the surface of the substrate. In order to laminate a oxide superconductor thin film $YBa_2Cu_3O_{7-x}$ having dissimilar crystal axis orientations, the substrate must be a single crystal. When the surface of the substrate is polycrystalline, it is allowed to obtain the c-axis oriented polycrystalline film only since the crystals of the 123-type copper oxide superconductor thin film rapidly grow along the a-b plane. Since this thin film is polycrystalline, the 123-type copper oxide superconductor thin film laminated thereon is oriented in the c-axis direction only. That is, the laminated films of the same axis orientation only are formed.

When the crystalline structure in the surface of the substrate is of a single crystal, a single crystal thin film (lower layer) of the 123-type copper oxide superconductor can be formed thereon. In laminating the 123-type copper oxide superconductor thin film (upper layer) thereon, it becomes possible to form a single crystal thin film of the 123-type copper oxide superconductor having a dissimilar crystal axis orientation when the lattice constants are different between the upper layer and the lower layer at the time of forming films. In practice, however, neither lattice constants of the upper layer and the lower layer nor the method of forming films for realizing the lattice constants have been known. Therefore, the upper layer is formed having the same crystal axis orientation as the lower layer, and it has not yet been succeeded in laminating a thin oxide film of a layered crystal structure having a dissimilar crystal axis orientation.

SUMMARY OF THE INVENTION

The object of the present invention therefore is to provide a production process which makes it possible to laminate 123-type copper oxide superconductor thin films having dissimilar crystal axis orientations.

Another object of the present invention is to provide a laminate of 123-type copper oxide superconductor thin films exhibiting excellent superconducting property and to provide a wiring for Josephson junction.

In order to accomplish the above-mentioned objects according to the present invention, a process of the present invention comprises forming a c-axis oriented single crystalline thin film of an oxide superconductor having a Y:Ba:Cu atomic ratio of substantially 1:2:3 and a lattice constant of 11.60 angstroms $\leq c \leq$ 11.70 angstroms at a temperature of 20° C. under an oxygen partial pressure of 160 Torr on a single crystalline substrate, and forming an a-axis oriented single crystalline thin film of the above oxide superconductor on the above laminated film relying upon a sputter deposition method.

Desirably, the c-axis oriented single crystalline thin film of the oxide superconductor is heat-treated at a temperature of from 600° C. to 850° C. under an oxygen partial pressure of from 0.1 mTorr to 100 mTorr prior to laminating the a-axis oriented single crystalline thin film of the oxide superconductor.

As a method of forming the c-axis oriented single crystalline thin film, there can be desirably used a pulse laser deposition method.

As the substrate, use is made of a substrate obtained by epitaxially growing a buffer layer on the single crystalline substrate, or an $SrTiO_3$ (100) single crystalline substrate.

According to a preferred process, an $SrTiO_3$ (100) single crystal is used as a substrate, a c-axis oriented single crystalline thin film of an oxide superconductor having the formula $YBa_2Cu_3O_{7-x}$ (x is a number of zero to 1) and a lattice constant of 11.60 angstroms$\leq c \leq$11.70 angstroms at a temperature of 20° C. under an oxygen partial pressure of 160 Torr, is formed on the substrate by a pulse laser deposition method while maintaining the substrate at a temperature of from 600° C. to 850° C., and an a-axis oriented single crystalline thin film of said oxide superconductor is laminated on said thin film by a sputter deposition method while maintaining the substrate at a temperature of from 500° C. to 800° C.

According to another preferred process, an $SrTiO_3$ (100) single crystal is used as a substrate, a c-axis oriented single crystalline thin film of an oxide superconductor having the formula $YBa_2Cu_3O_{7-x}$ (x is a number of zero to 1) and a lattice constant of 11.60 angstroms$\leq c \leq$11.70 angstroms at a temperature of 20° C. under an oxygen partial pressure of 160 Torr, is formed on the substrate by a pulse laser deposition method while maintaining the substrate at a temperature of from 600° C. to 850° C., said thin film is heat-treated at a temperature of from 600° C. to 850° C. under an oxygen partial pressure of from 0.1 mTorr to 100 mTorr, and an a-axis oriented single crystalline thin film of said oxide superconductor is laminated on said thin film by a sputter deposition method while maintaining the substrate at a temperature of from 500° C. to 800° C.

A laminate of oxide superconductor thin films of the present invention comprises a single crystalline substrate, a c-axis oriented single crystalline thin film of an oxide superconductor having the formula $YBa_2Cu_3O_{7-x}$ (x is a number of from zero to 1) formed on said substrate, and an a-axis oriented single crystalline thin film of said oxide superconductor formed on said c-axis oriented single crystalline thin film, the c-axis oriented single crystalline thin film being a single crystalline thin film having a lattice constant of 11.60 angstroms$\leq c \leq$11.70 angstroms at a temperature of 20° C. under an oxygen partial pressure of 160 Torr.

The c-axis oriented single crystalline thin film has a thickness of from 1 to 1000 nm and, particularly, from 10 to 500 nm, and the a-axis oriented single crystalline thin film has a thickness of from 1 to 1000 nm and, particularly, from 10 to 500 nm.

In order to laminate the 123-type copper oxide superconductor having dissimilar crystal axis orientation, the single crystalline substrate must have a uniformalized crystal axis orientation. When the thin oxide film is laminated on the single crystalline substrate, what determines the crystal axis orientation is the matching between the lattice constant of the substrate and the lattice constant of the thin oxide film.

In the 123-type copper oxide superconductor thin film having anisotropy in the lattice constant, crystals grow along the crystal axis orientation that matches well with the lattice constant of the substrate. When the 123-type copper oxide superconductor thin film is laminated as an upper layer on the lower layer that is formed by depositing the same 123-type copper oxide superconductor thin film on the single crystalline substrate as described above, the lower layer and the upper layer are necessarily laminated maintaining the same axis orientation provided the lower layer and the upper layer have the same lattice constant.

According to the present invention, on the other hand, the lattice constant of c-axis of the 123-type copper oxide superconductor of the lower layer is limited to lie within a predetermined range of 11.60 angstroms$\leq c \leq$11.70 angstroms and, besides, the sputter deposition method is employed as a method of forming the upper layer. Despite the same crystalline structure, therefore, the lower layer and the upper layer have dissimilar c-axis lattice constants. Therefore, the thin film having a crystal axis orientation different from that of the lower layer exhibits better lattice constant matching than that of the thin film that has the same crystal axis orientation as the lower layer. It is thus allowed to laminate the upper layer having a crystal axis orientation different from that of the lower layer.

As shown in Comparative Example 1, when the upper portion of the 123-type copper oxide superconductor has a larger c-axis lattice constant than the above-mentioned range, even if the sputter deposition method, for example, is used as the film-forming method, an upper layer of an a-acis oriented single crystalline thin film cannot be formed.

Even when the lower layer of the 123-type copper oxide superconductor has the c-axis lattice constant within the above-mentioned range, the c-axis oriented single crystalline thin film is merely formed when the methods other than the sputter deposition method are employed for forming the film. That is, the upper layer of the a-axis oriented single crystalline thin film is not formed.

According to the present invention, on the other hand, the lower layer is the c-axis oriented single crystalline thin film having a c-axis lattice constant that lies within a predetermined range though it is composed of the same 123-type copper oxide superconductor, and the upper layer is formed by the sputter deposition method, whereby it is allowed to produce a laminate of oxide superconductor thin films in which the a-axis oriented single crystalline thin film is laminated on the c-axis oriented single crystalline thin film.

Besides the laminate comprising the c-axis oriented single crystalline thin film and the a-axis oriented single crystalline thin film of the present invention features very favorable electric connection between the two thin films, has a high critical current, and is useful as a wiring for Josephson connection.

Reference should be made to FIG. 9 in which are plotted relationships between the absolute temperature T represented by the abscissa and the critical current Ic represented by the ordinate using the laminate of c-axis oriented single crystalline thin film and a-axis oriented single crystalline thin film of the present invention and and by using the a-axis oriented single crystalline thin film. It will be obvious that the laminate of the present invention exhibits not only very large Ic but also very favorable electric connection between the two thin films being greatly contributed by a current that flows through the c-axis oriented single crystalline thin film.

In general, the lattice constant of the thin oxide film varies depending upon the oxygen partial pressure and the temperature. In the present invention, the lattice constant c of the c-axis oriented single crystalline thin film is specified under 160 Torr at 20° C. because of the reason that this measuring condition has been set to be room temperature atmospheric pressure condition.

According to the present invention, the sputter deposition method is used for forming the upper layer on account of the reasons described below. In the case of the 123-type copper oxide superconductor, a thin film having an ideal lattice constant can be obtained by the deposition method such as a pulse laser deposition method or the like method other than the sputter deposition method. However, the sputter deposition method is subject to be affected by non-equilibrium thermodynamic conditions due to plasma, and the lattice constant of the thin film is often deviated from the ideal value. According to Superconductor Science & and Technology, Volume 5, 1992, pp. 283–239 by A. P. Shapavalov et al., there has been reported that with the 123-type copper oxide superconductor thin film formed by the sputter deposition method, the lattice constant of c-axis becomes larger than the ideal value of 11.60 angstroms$\leq c \leq$11.70 angstroms as measured at a temperature of 20° C. under an oxygen partial pressure of 160 Torr without almost permitting the critical temperature to drop. According to the present invention, it is made possible to form, on the c-axis oriented single crystal thin film, a layer having a different lattice constant by utilizing the phenomenon in that the c-axis lattice constant becomes larger than the ideal value when the sputter deposition method is employed.

Prior to laminating the upper layer, furthermore, the heat-treatment is carried out under particular conditions, i.e., at a temperature of from 600° C. to 850° C. under an oxygen partial pressure of from 0.1 mTorr to 100 mTorr to change the lattice constant of the lower layer, so that the upper layer having a different axis orientation of crystal axis can be easily laminated thereon.

On the other hand, the lower layer of the 123-type copper oxide superconductor can be formed by a deposition method other than the sputter deposition method. Among these deposition methods, the pulse laser deposition method makes it possible to easily form a film having an ideal lattice constant. To form the lower layer, therefore, the c-axis oriented single crystalline thin film is formed by the pulse laser deposition method, the c-axis oriented single crystalline thin film having the formula $YBa_2Cu_3O_{7-x}$ (x is a number of zero to 1) and a lattice constant of 11.60 angstroms$\leq c \leq$11.70 angstroms under the measuring conditions of a temperature of 20° C. and an oxygen partial pressure of 160 Torr. Then, the a-axis oriented single crystalline thin film of the formula $YBa_2Cu_3O_{7-x}$ is laminated as the upper layer by the sputter deposition method. Despite the same crystalline structure, therefore, the lattice constant can be greatly changed between the lower layer and the upper layer, so that the lower layer and the upper layer will have different crystal axis orientations.

DESCRIPTION OF THE PREFERRED EMBODIMENTS

Figure 1:
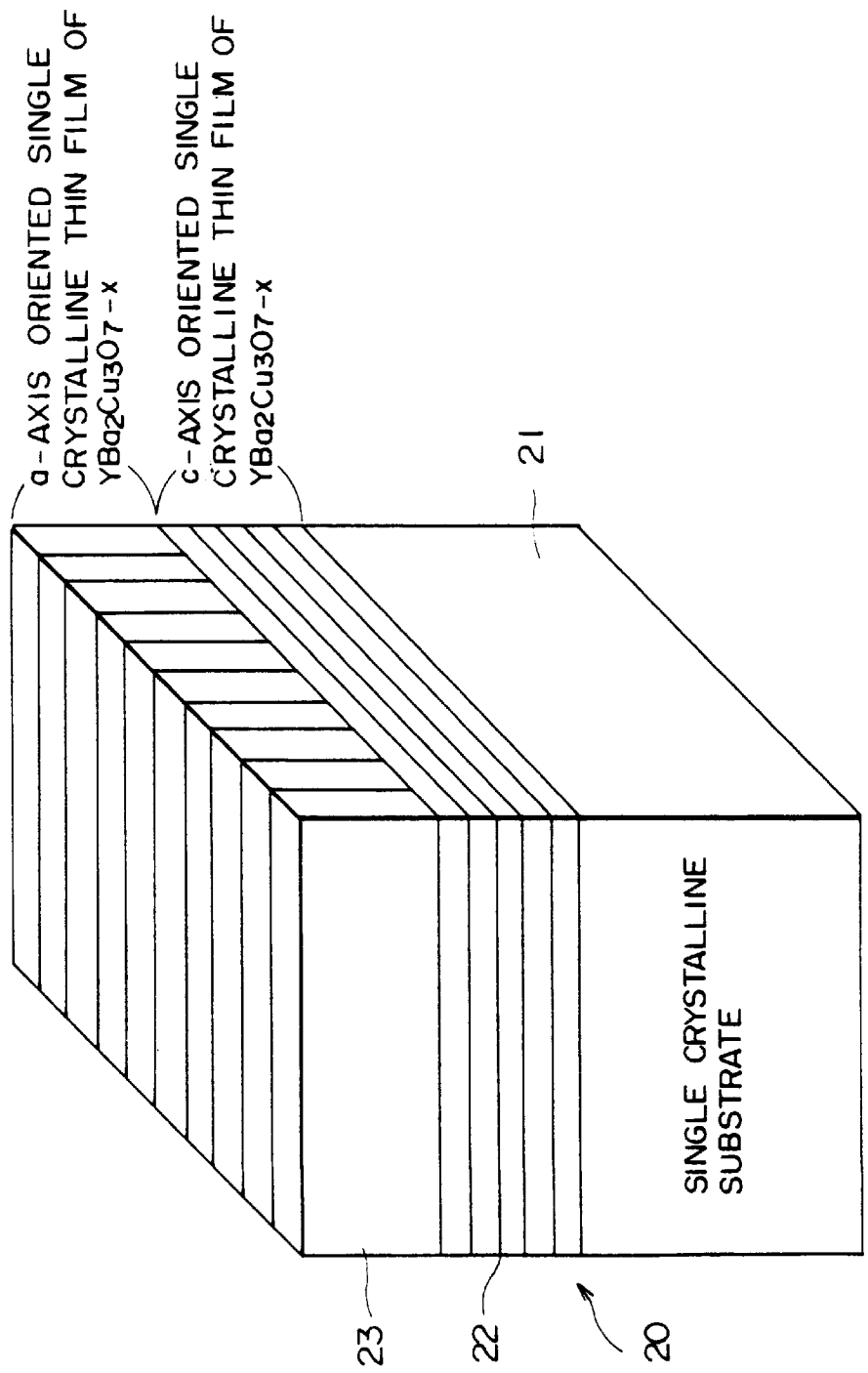
FIG. 1 is a perspective view illustrating the structure of a laminate of 123-type copper oxide superconductor thin films of the present invention.

Referring to FIG. 1 illustrating the structure of a laminate of 123-type copper oxide superconductor thin films of the present invention, the laminate 20 comprises a single crystalline substrate 21, a lower layer 22 of a c-axis oriented single crystalline thin film of the 123-type copper oxide superconductor formed on the surface of the substrate 21, and an upper layer 23 of an a-axis oriented single crystalline thin film of the 123-type copper oxide superconductor formed thereon.

The single crystalline substrate used in the present invention is of a single crystalline form, and any substrate can be used provided it has good matching with the lattice constant of the 123-type copper oxide superconductor (YBCO) thin film. Though an $SrTiO_3$ (100) single crystal is particularly preferred, it is also allowable to use such single crystalline substrates as MgO, $LaAlO_3$, $Y_2O_3$, $YBa_2Cu_3O_7$, $Y_2O_3$-stabilized $ZrO_2$ (YSZ), etc. on which it has now been known that the YBCO film epitaxially grows.

Even with those substrates that permit elements to easily diffuse at a film-forming temperature or that exhibit poor lattice constant matching, the effect by diffusion can be prevented or the lattice constant matching can be improved by epitaxially growing a buffer layer on the surface of the substrate to little permit diffusion of elements and to exhibit good lattice constant matching. As such a buffer layer, there can be used, for example, $SrTiO_3$, $LaAlO_3$, $Y_2O_3$, $CeO_2$ and $Y_2O_3$-stabilized $ZrO_2$ (YSZ).

As the 123-type copper oxide superconductor, there can be used the one having a composition formula $YBa_2Cu_3O_{7-x}$ (x is a number of from zero to 1) and, particularly, the one in which x is zero to 0.5.

Figure 3:
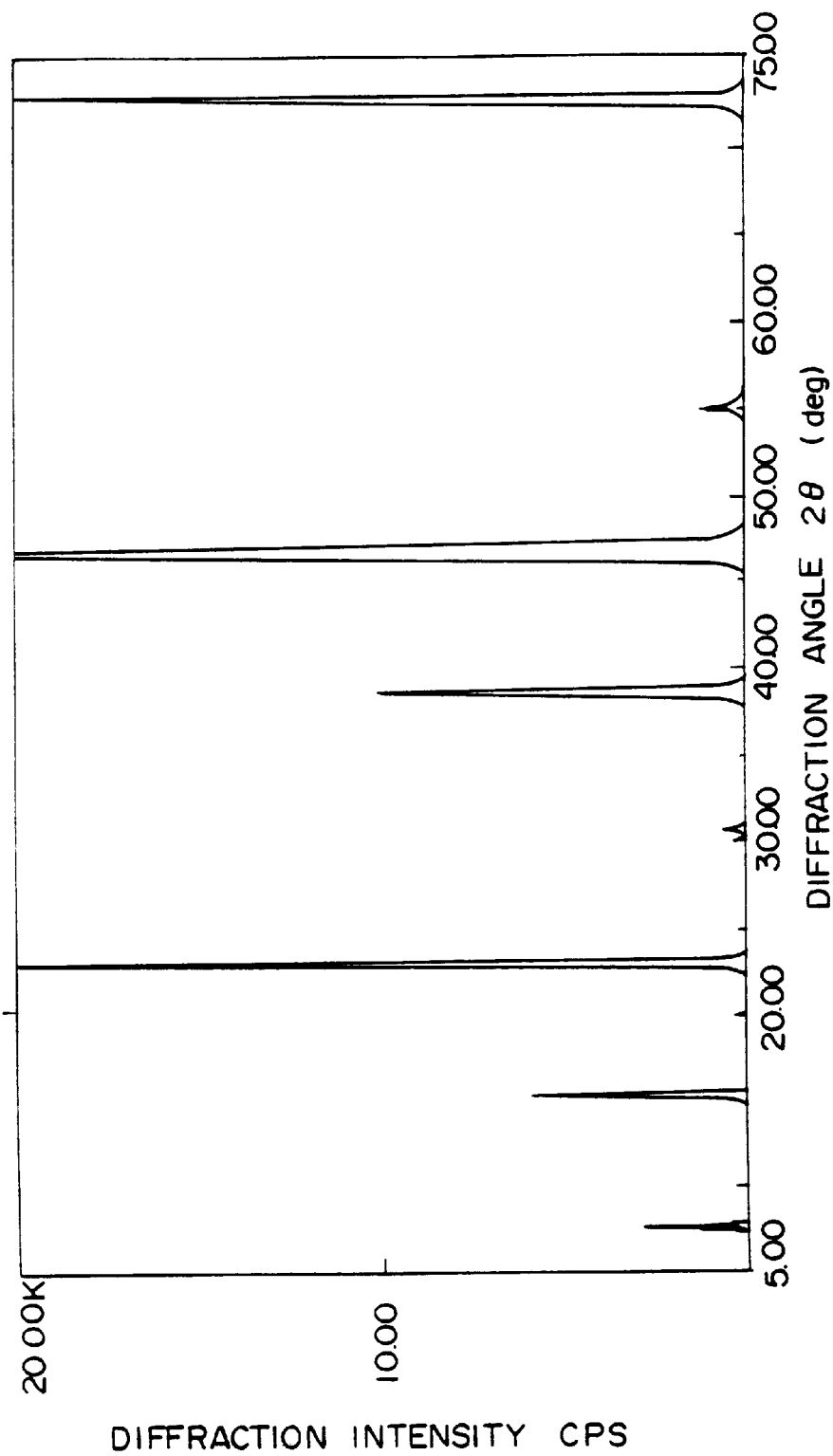
FIG. 3 shows an X-ray diffraction pattern of a c-axis oriented single crystalline thin film having the formula $YBa_2Cu_3O_{7-x}$ and having a lattice constant c of 11.67 angstroms at a temperature of 20° C. under an oxygen partial pressure of 160 Torr, that is formed on an $SrTiO_3$ (100) single crystalline substrate by a pulse laser deposition method.

In the laminate of oxide superconductor thin films of the present invention, the lower layer of the c-axis oriented single crystalline thin film has a lattice constant in a range of 11.60 angstroms $\leq c \leq$ 11.70 angstroms, and FIG. 3 shows an X-ray diffraction pattern of the c-axis oriented single crystalline thin film that is formed on an $SrTiO_3$ (100) single crystalline substrate.

Though there is no particular limitation, the thickness of the lower layer should generally be within a range of from 1 to 1000 nm.

Figure 5:
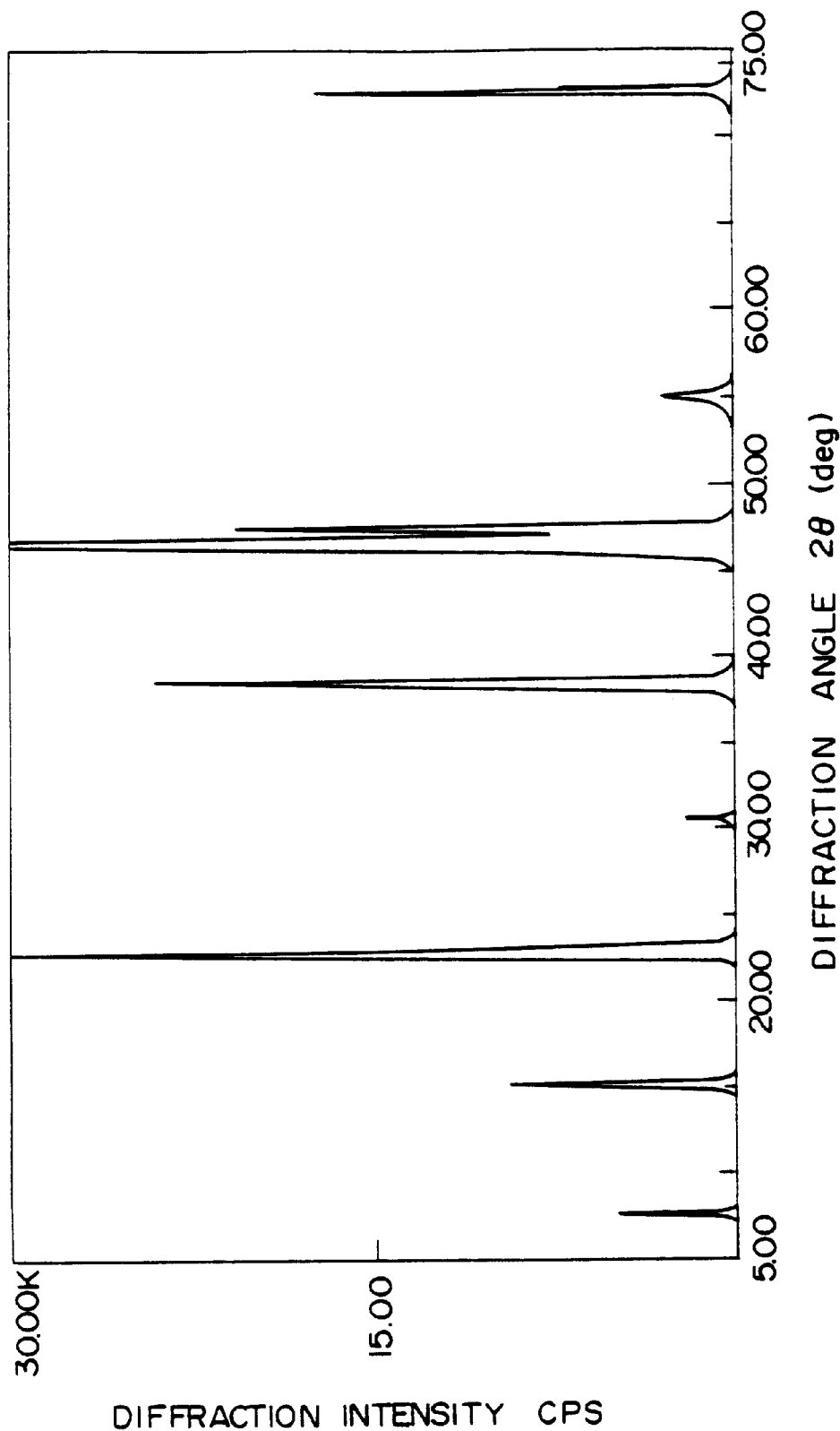
FIG. 5 shows an X-ray diffraction pattern of an a-axis oriented single crystalline thin film having the formula $YBa_2Cu_3O_{7-x}$ that is formed by an RF magnetron sputter deposition method on the c-axis oriented single crystalline thin film having the formula $YBa_2Cu_3O_{7-x}$ and a lattice constant c of 11.67 angstroms at a temperature of 20° C. under an oxygen partial pressure of 160 Torr, that is formed on the $SrTiO_3$ (100) single crystalline substrate.

The upper layer of the a-axis oriented single crystalline thin film is provided on the c-axis oriented single crystalline thin film. FIG. 5 shows an X-ray diffraction pattern of the laminate which is provided with the a-axis oriented single crystalline thin film, from which will be confirmed the presence of peaks specific to the a-axis oriented single crystalline thin film (refer to Example 1 appearing later).

Though there is no particular limitation, the thickness of the upper layer should generally be from 1 to 1000 nm.

In the laminate of the present invention, particularly favorable electric junction is accomplished in the boundary surface between the a-axis oriented single crystalline thin film and the c-axis oriented single crystalline thin film (refer to Example 3 appearing later).

According to the production process of the present invention, first, the c-axis single crystalline thin film of the 123-type copper oxide superconductor is formed on the single crystalline substrate by a deposition method such as a pulse laser deposition method other than the sputter deposition method.

Figure 2:
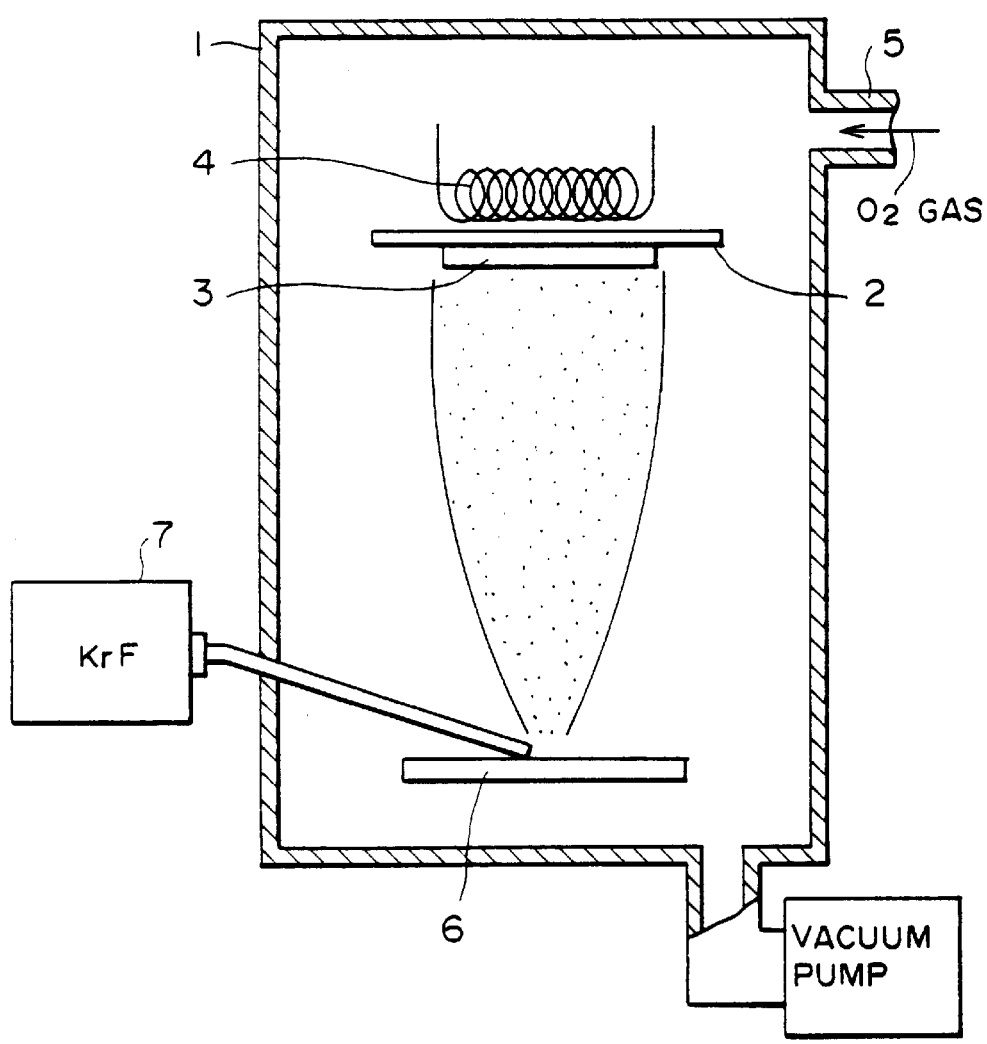
FIG. 2 is a sectional view schematically illustrating an apparatus for putting into practice the pulse laser deposition method employed in an embodiment of the present invention.

Referring to FIG. 2 explaining an apparatus that can be used for the pulse laser deposition method, a chamber 1 is capable of being evacuated. At an upper part in the chamber 1, a single crystalline substrate 3 is supported being faced downwards by a holder 2 and is heated by a heater 4. A target 6 is placed at a lower portion in the chamber 1, and is irradiated with a laser beam from a KrF laser 7 located on the outside of the chamber 1, in order to vaporize the surface of the target 6. The vapor of the target rises to the substrate 3 and deposits on the lower surface of the substrate 3 that is heated. The chamber 1 is provided with an inlet port 5 of an oxygen gas ($O_2$) so that the oxygen partial pressure can be adjusted in the chamber 1. This is the pulse laser deposition method.

As the 123-type copper oxide used as the target 6, there can be used polycrystal of a composite oxide of the above-mentioned composition. The polycrystal can be produced by a known method by using alkoxides or chelate compounds of Y, Ba and Cu, as well as oxygen.

In carrying out the pulse laser deposition, the substrate temperature should be from 600 to 850° C. and, particularly, from 700 to 820° C., and the oxygen partial pressure should be from 50 to 400 mTorr and, particularly, from 80 to 300 mTorr. The laser beam should have a wavelength of from 160 to 350 nm, and the density of incident energy should be from 1 to 6 $J/cm^2$ though there is no particular limitation.

The thin film that is formed is then cooled. There is no particular limitation in the conditions for cooling the thin film. After the thin film has been formed, the cooling should be effected in an oxygen atmosphere in which the oxygen partial pressure is relatively as high as from 1 to 760 Torr in order to obtain, in a thermodynamically equilibrium state, a predetermined lattice constant of the c-axis oriented single crystalline thin film of $YBa_2Cu_3O_{7-x}$ at a temperature of 20° C. under an oxygen partial pressure of 160 Torr. The c-axis oriented single crystalline thin film of $YBa_2Cu_3O_{7-x}$ having a lattice constant of, for example, c>11.70 may be obtained by effecting the cooling in a reducing atmosphere without almost introducing oxygen. Even in this case, however, the lattice constant of just before the thin film is formed by the sputter deposition method can be set to be a lattice constant in a thermodynamically equilibrium state under the sputtering conditions by effecting the heating. As a result, therefore, this is the same as when a thin film is formed on the c-axis oriented single crystalline thin film having a lattice constant of 11.60 angstroms $\leq c \leq$ 11.70.

In this sense, when the lattice constant of the c-axis oriented single crystalline thin film after the thin film is formed and after cooling is not lying within a range specified by the present invention, the c-axis oriented single crystalline thin film formed prior to forming the a-axis oriented single crystalline thin film should be heat-treated at a temperature of from 600° C. to 850° C. under an oxygen partial pressure of from 0.1 mTorr to 100 mTorr.

According to the present invention, the a-axis oriented single crystalline thin film is formed by the sputter deposition method on the c-axis oriented single crystalline thin film that is formed as described above.

Figure 4:
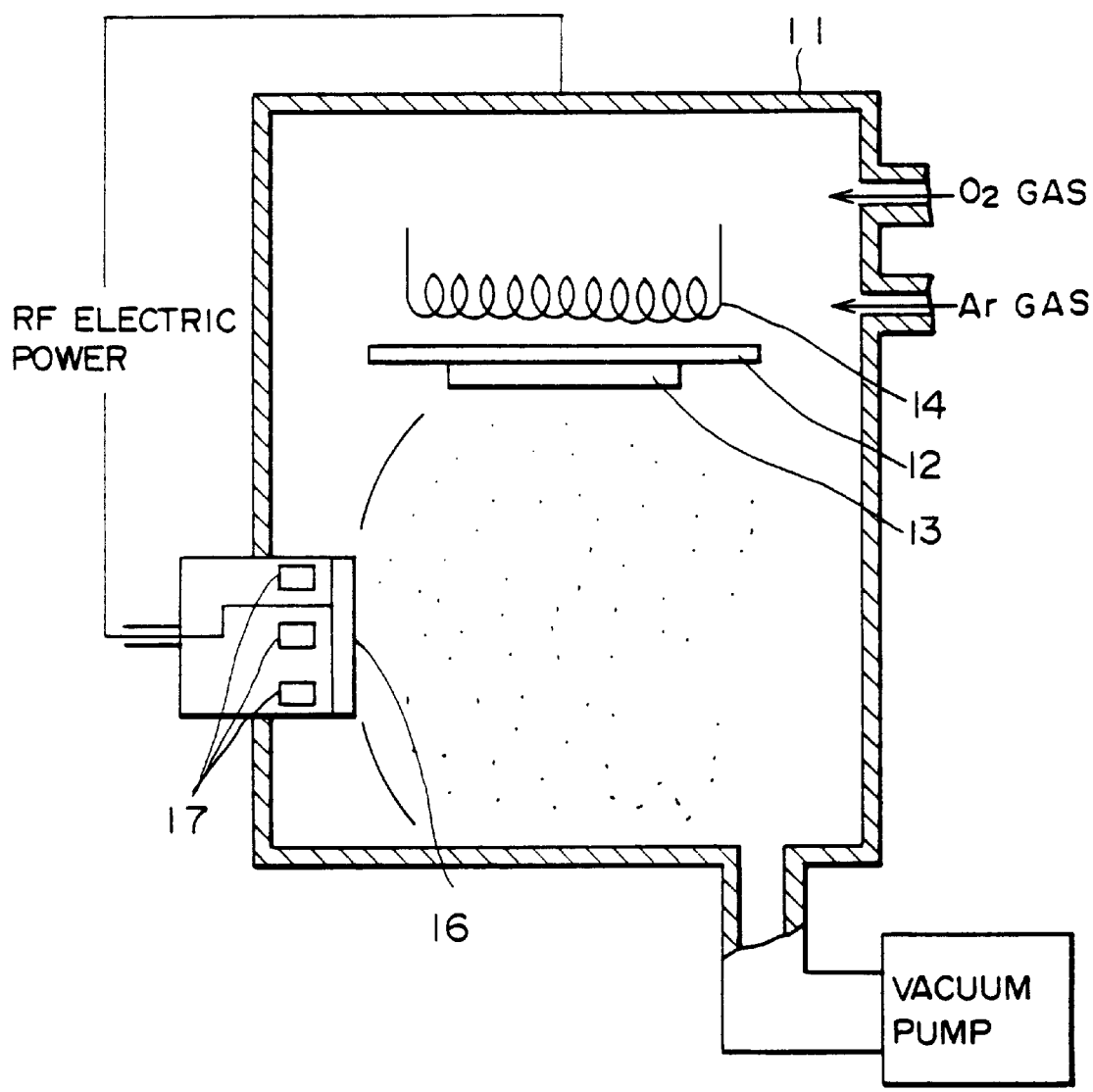
FIG. 4 is a sectional view schematically illustrating an apparatus for putting into practice the RF magnetron sputter deposition method employed in the embodiment of the present invention.

Referring to FIG. 4 which illustrates a device used for the sputter deposition method of the present invention, this device is an RF magnetron sputter deposition device. In FIG. 4, a chamber 11 is capable of being evacuated. At an upper portion in the chamber 11, a substrate 13 in which the c-axis oriented single crystalline thin film has been formed already is supported being faced downwards by a holder 12, and is heated by a heater 14. Into the chamber 11 has been introduced an argon gas and an oxygen gas in advance prior to raising the substrate temperature. A target 16 is mounted on the side wall of the chamber 11, and magnets 17 are placed by the side thereof. An RF (radio-frequency) electric power is applied across the target 16 and the chamber 11, so that argon ions are converged and come into collision with the target 16 being attracted by the magnets 17 and that the target material is driven out due to the collision. The material arrives at the substrate 13 and deposits on the lower surface of the substrate that is heated. This is the sputter (RF magnetron sputter) deposition method.

In the sputter deposition method, it is desired that the substrate temperature is maintained at from 500 to 800° C. and, particularly, from 600 to 720° C., the oxygen partial pressure is maintained to be from 4 to 100 mTorr, and the argon partial pressure is maintained to be from 10 to 500 mTorr.

The RF electric power should have a frequency of from 13 to 95 MHz and an output of from about 40 to about 200 W.

The laminate on which is formed the predetermined a-axis oriented single crystalline thin film is cooled to obtain a product of the present invention. The oxygen partial pressure during the cooling after the film is formed should create an oxidizing atmosphere, e.g., from 1 to 760 Torr, and the cooling rate after the film is formed should be from 100 to 10,000° C./h.

The laminate of 123-type oxide superconductor thin films of the present invention is provided with connection terminals and may further be provided with a protection coating by known means.

EXAMPLES

The invention will be described below in further detail by way of Examples.

Though the Examples use an $SrTiO_3$ (100) single crystalline substrate, it should be noted that the substrate is in no way limited thereto only.

Example 1

In Example 1, first, a pulse laser deposition method was used for forming a c-axis oriented single crystalline thin film of $YBa_2Cu_3O_{7-x}$. The thin film was formed by using the device shown in FIG. 2. Conditions for forming the thin film were as follows:

| | |
|---|---|
| Substrate | $SrTiO_3$ (100) single crystalline substrate |
| Target | $YBa_2Cu_3O_{7-x}$ polycrystal |
| Substrate temp. | 790° C. |
| Oxygen partial pressure | 100 mTorr |
| Film-forming time | 15 min. |
| Film thickness | 150 nm |
| KrF laser energy density 5J/cm$^2$ wavelength | 248 nm |
| Oxygen partial pressure during cooling after film has been formed | 500 Torr |
| Cooling rate after film has been formed | 800° C./h |
| Cooling temperature | 20° C. |

The thin film that was formed was cooled at 20° C.

FIG. 3 illustrates an X-ray diffraction pattern (X-ray source: CuKα) of the thin film grown by this method at a temperature of 20° C. under an oxygen partial pressure of 160 Torr. The abscissa represents the diffraction angle 2θ and the ordinate represents the diffraction intensity. Here, peaks at 22.8°, 46.5° and 72.6° are those of the $SrTiO_3$ single crystalline substrate. Intense peaks are appearing at 7.6°, 15.2°, 30.7°, 38.6° and 55.0° from which it will be understood that the film is the c-axis oriented single crystalline thin film of $YBa_2Cu_3O_{7-x}$ having a lattice constant of c=11.67 angstroms at a temperature of 20° C. under an oxygen partial pressure of 160 Torr.

Next, a single crystalline thin film of the a-axis oriented $YBa_2Cu_3O_{7-x}$ was formed on the c-axis oriented single crystalline thin film by the sputter deposition method. The thin film was moved from the pulse laser deposition device to the sputter deposition device in a manner that it was not exposed to the open air so that no impurity adhered to the surface of the thin film.

In this embodiment, in moving the thin film from the pulse laser deposition device to the sputter deposition device, the temperature of the thin film was once set to 20° C. and the oxygen partial pressure was adjusted to be 160 Torr. However, the temperature and the oxygen partial pressure at the time of moving the thin film may be arbitrarily selected as far as the thin film is not decomposed.

The thin film was formed by using the RF magnetron sputter deposition device shown in FIG. 4. Conditions for forming the thin film were as follows:

| | |
|---|---|
| Substrate | $SrTiO_3$ (100) single crystalline substrate on which was laminated a c-axis oriented single crystalline thin film of $YBa_2Cu_3O_{7-x}$ having a lattice constant of c = 11.67 angstroms at 20° C. under an oxygen partial pressure of 160 Torr |
| Target | $YBa_2Cu_3O_{7-x}$ polycrystal |
| Substrate temp. | 640° C. |
| Oxygen partial pressure | 32 mTorr |
| Argon partial pressure | 128 mTorr |
| RF output | 120 W |
| Film-forming time | 90 min. |
| Film thickness | 200 nm |
| Oxygen partial pressure during cooling after film has been formed | 500 Torr |
| Cooling rate after film has been formed | 800° C./h |
| Cooling temperature | 20° C. |

The thin film that was formed was cooled at 20° C.

FIG. 5 illustrates an X-ray diffraction pattern (X-ray source: CuKα) of the thin film grown by this method at a temperature of 20° C. under an oxygen partial pressure of 160 Torr, wherein the abscissa represents the diffraction angle 2θ and the ordinate represents the diffraction intensity. Intense peaks are appearing at 23.3° and 47.5° in addition to peaks of the $SrTiO_3$ (100) single crystalline substrate shown in FIG. 5 and peaks of the c-axis oriented single crystalline thin film of $YBa_2Cu_3O_{7-x}$, from which it will be understood that on the thin film has been laminated an a-axis oriented single crystalline thin film of $YBa_2Cu_3O_{7-x}$.

It will be understood from these results that the a-axis oriented single crystalline thin film of $YBa_2Cu_3O^{7-x}$ has been formed on the c-axis oriented single crystalline thin film of $YBa_2Cu_3O_{7-x}$.

Example 2

A c-axis oriented single crystalline thin film of $YBa_2Cu_3O_{7-x}$ having a lattice constant of c=11.67 angstroms and the same X-ray diffraction pattern as that of FIG. 3 was formed on the surface of the $SrTiO_3$ (100) single crystalline substrate by quite the same method as that of Example 1.

The thin film was then heat-treated in the sputter deposition device. The thin film was moved from the pulse laser deposition device to the sputter deposition device in a manner that it was not exposed to the open air so that no impurity adhered to the surface of the thin film. In this embodiment, in moving the thin film from the pulse laser deposition device to the sputter deposition device, the temperature of the thin film was once set to 20° C. and the oxygen partial pressure was adjusted to be 160 Torr. However, the temperature and the oxygen partial pressure at the time of moving the thin film may be arbitrarily selected as far as the thin film is not decomposed.

The heat-treating conditions were as follows:

| | |
|---|---|
| Substrate temp. | 640° C. |
| Oxygen partial pressure | 1.1 mTorr |
| Heat-treating time | 60 min. |

By effecting the heat treatment without activated oxygen that generates during the pulse laser deposition or sputter deposition, it is allowed to more greatly change the lattice constant of $YBa_2Cu_3O_{7-x}$ than the lattice constant at the time of forming the film.

Immediately after the heat treatment, the a-axis oriented $YBa_2Cu_3O_{7-x}$ single crystalline thin film was formed on the c-axis oriented single crystalline thin film by the same method as that of Example 1, i.e., by the sputter deposition method under quite the same conditions as in Example 1.

Figure 6:
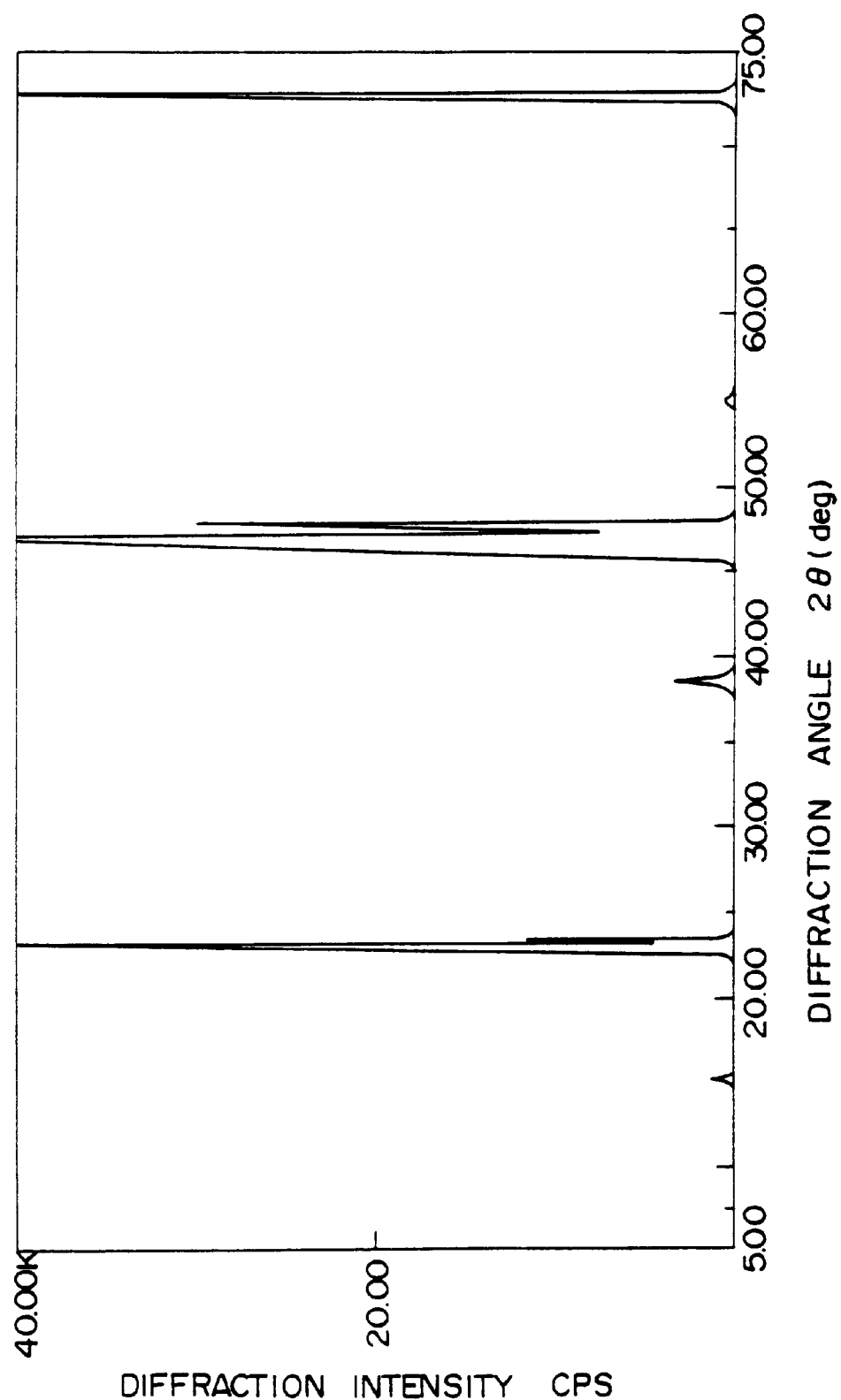
FIG. 6 shows an X-ray diffraction pattern of an a-axis oriented single crystalline thin film having the formula $YBa_2Cu_3O_{7-x}$ that is formed by the RF magnetron sputter deposition method after the c-axis oriented single crystalline thin film having the formula $YBa_2Cu_3O_{7-x}$ and a lattice constant c of 11.67 angstroms at a temperature of 20° C. under an oxygen partial pressure of 160 Torr formed on the $SrTiO_3$ (100) single crystalline substrate, has been heat-treated at a temperature of 640° C. under an oxygen partial pressure of 1.1 mTorr.

FIG. 6 is an X-ray diffraction pattern (X-ray source: CuKα) of the thin film grown by this method at a temperature of 20° C. under an oxygen partial pressure of 160 Torr, wherein the abscissa represents the diffraction angle 2θ and the ordinate represents the diffraction intensity. Intense peaks are appearing at 23.3° and 47.6° in addition to peaks of the $SrTiO_3$ (100) single crystalline substrate shown in FIG. 3 and peaks of the c-axis oriented single crystalline thin film of $YBa_2Cu_3O_{7-x}$, from which it will be understood that on the thin film has been laminated an a-axis oriented single crystalline thin film of $YBa_2Cu_3O_{7-x}$.

When compared with FIG. 5 illustrating the results of Example 1 in which the heat treatment was not effected, it will be understood that the intensity ratio of the peak at 38.6° which is a peak in the c-axis orientation to the peak at 47.6° which is a peak in the a-axis orientation in FIG. 5 is a/c=1, whereas in FIG. 6 in which the heat treatment was effected, the intensity ratio is a/c=9. It will therefore be understood that the volume of a-axis orientation in the upper layer increases when the heat-treatment is carried out. The optimum heat-treatment conditions for increasing the volume of the a-axis orientation are a temperature of from 600 to 850° C. and an oxygen partial pressure of from 0.1 mTorr to 100 mTorr.

When the temperature is higher than 850° C., the thin film decomposes and when the temperature is lower than 600° C., the thin film is little different from those that are not heat-treated. When the oxygen partial pressure is smaller than 0.1 mTorr, the thin film decomposes and when the oxygen partial pressure is larger than 100 mTorr, the thin film is little different from those that are not heat-treated.

Comparative Example 1

In this Comparative Example is explained the importance of limiting the lattice constant in the lower layer to lie within a range of 11.60 angstroms≦c≦11.70 angstroms.

Here, the sputter deposition method was employed for forming the thin film that was the lower layer. The thin film was formed by using the RF magnetron sputter deposition device explained above with reference to FIG. 4.

Conditions for forming the thin film were as follows:

| | |
|---|---|
| Substrate | $SrTiO_3$ (100) single crystalline substrate |
| Target | $YBa_2Cu_3O_{7-x}$ polycrystal |

-continued

| | |
|---|---|
| Substrate temp. | 740° C. |
| Oxygen partial pressure | 4 mTorr |
| Argon partial pressure | 76 mTorr |
| RF output | 80 W |
| Film-forming time | 60 min. |
| Film thickness | 200 nm |
| Oxygen partial pressure during cooling after film has been formed | 500 Torr |
| Cooling rate after film has been formed | 800° C./h |
| Cooling temperature | 20° C. |

The thin film that was formed was cooled at 20° C.

Figure 7:
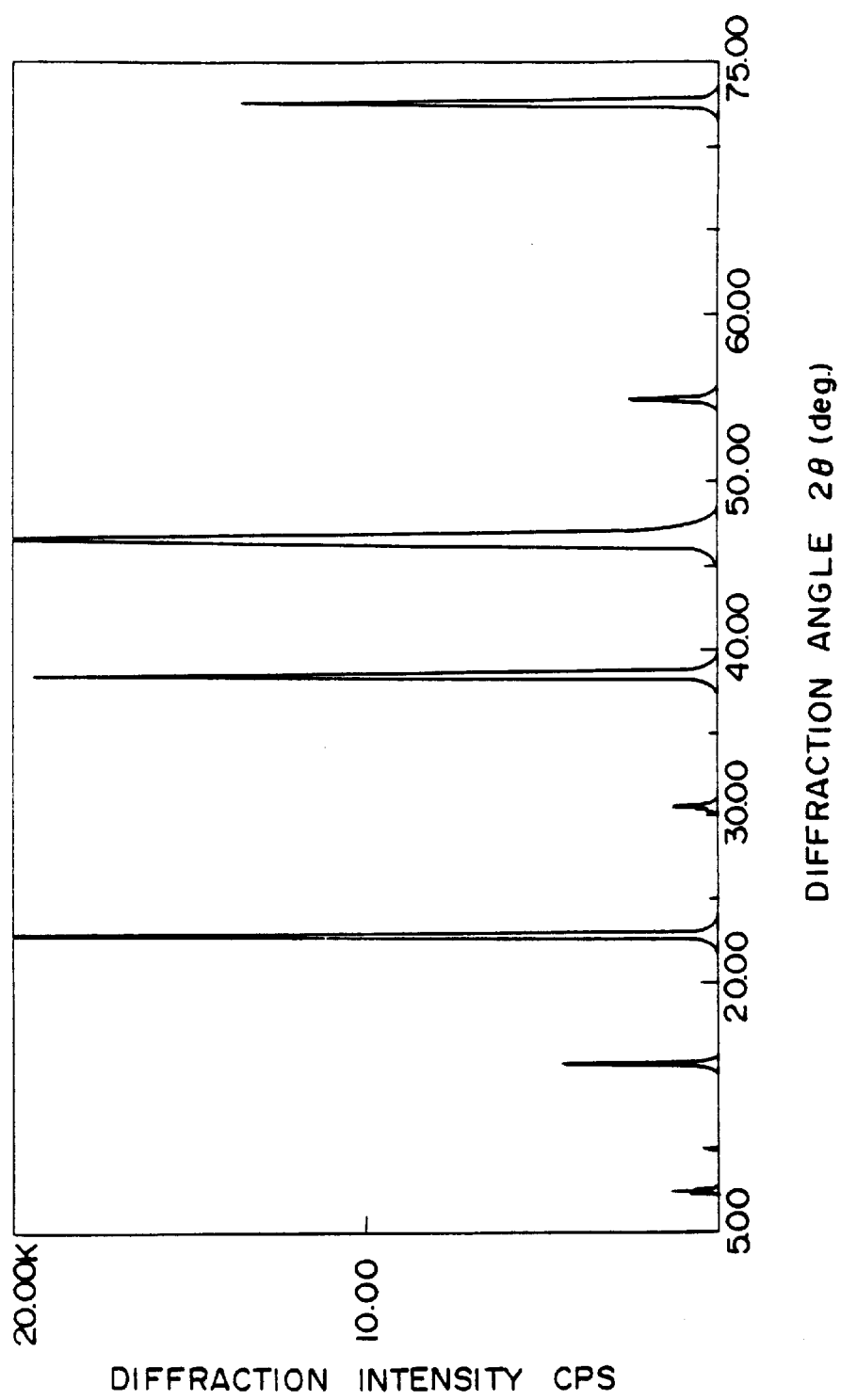
FIG. 7 shows an X-ray diffraction pattern of a c-axis oriented single crystalline thin film having the formula $YBa_2Cu_3O_{7-x}$ and a lattice constant c of 11.72 angstroms at a temperature of 20° C. under an oxygen partial pressure of 160 Torr, that is formed on an $SrTiO_3$ (100) single crystalline substrate by the pulse laser deposition method.

FIG. 7 illustrates an X-ray diffraction pattern (X-ray source: CuKα) of the thin film grown by this method at a temperature of 20° C. under an oxygen partial pressure of 160 Torr, wherein the abscissa represents the diffraction angle 2θ and the ordinate represents the diffraction intensity. Here, the peaks appearing at 22.8°, 46.5° and 72.6° are those of the $SrTiO_3$ (100) single crystalline substrate. Intense peaks are appearing at 7.6°, 15.1°, 30.5°, 38.4° and 54.8°, from which it will be understood that the film is a c-axis oriented single crystalline thin film of $YBa_2Cu_3O_{7-x}$ having a lattice constant of c=11.72 angstroms at a temperature of 20° C. under an oxygen partial pressure of 160 Torr.

Next, it was attempted to form an a-axis oriented $YBa_2Cu_3O_{7-x}$ single crystalline thin film on the c-axis oriented single crystalline thin film by the sputter deposition method.

The conditions for forming the thin film were the same as those of forming the a-axis oriented $YBa_2Cu_3O_{7-x}$ single crystalline thin film of Example 1.

Figure 8:
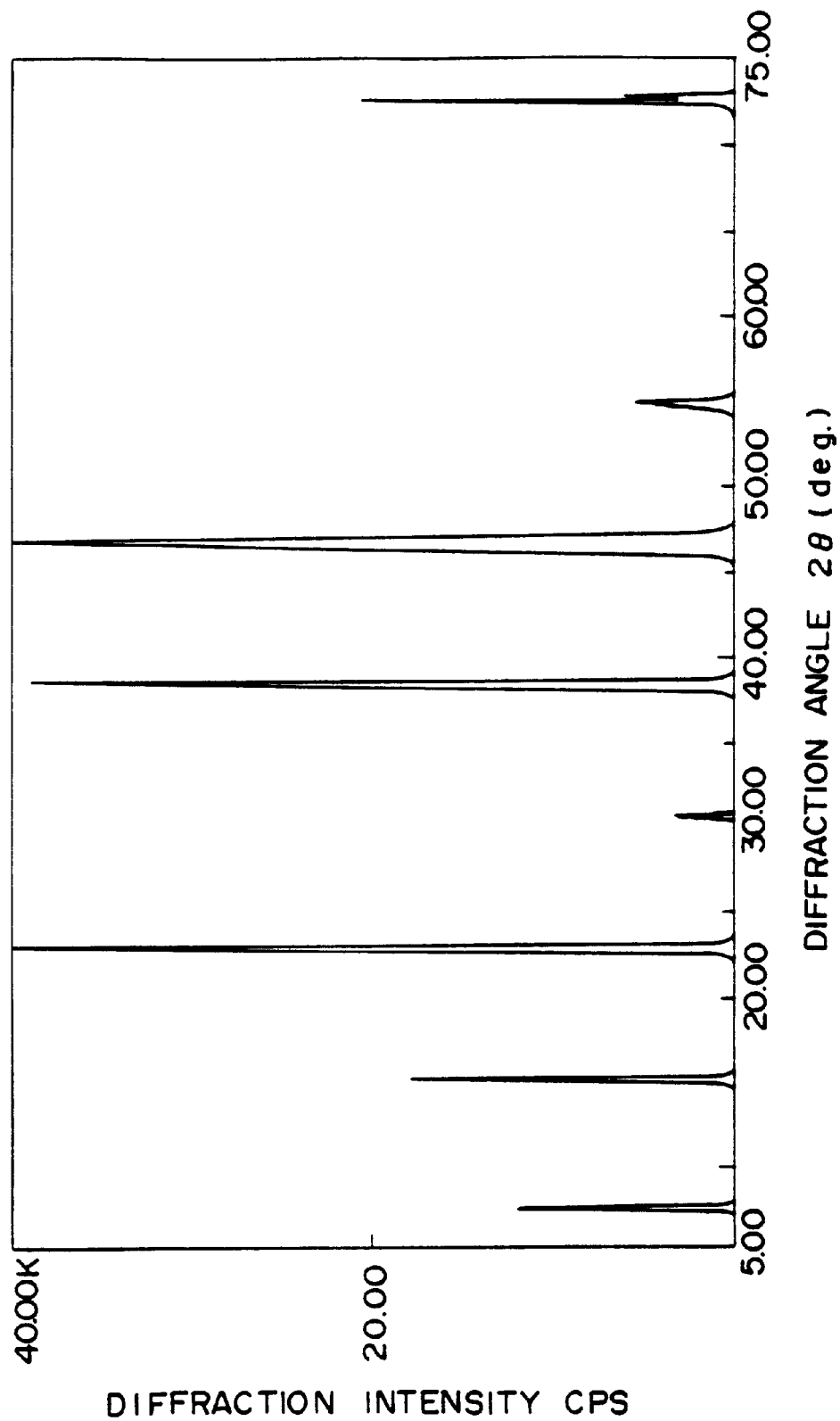
FIG. 8 shows an X-ray diffraction pattern of an a-axis oriented single crystalline thin film having the formula $YBa_2Cu_3O_{7-x}$ that is formed by an RF magnetron sputter deposition method on the c-axis oriented single crystalline thin film having the formula $YBa_2Cu_3O_{7-x}$ and a lattice constant c of 11.72 angstroms at a temperature of 20° C. under an oxygen partial pressure of 160 Torr, that is formed on the $SrTiO_3$ (100) single crystalline substrate.

FIG. 8 illustrates an X-ray diffraction pattern (X-ray source: CuKα) of the thin film grown by this method at a temperature of 20° C. under an oxygen partial pressure of 160 Torr, wherein the abscissa represents the diffraction angle 2θ and the ordinate represents the diffraction intensity. Here, the peaks appearing at 22.8°, 46.5° and 72.6° are those of the $SrTiO_3$ (100) single crystalline substrate. Intense peaks are appearing at 7.6°, 15.1°, 30.5°, 38.4° and 54.8° from which it will be understood that the film is a c-axis oriented single crystalline thin film of $YBa_2Cu_3O_{7-x}$ having a lattice constant of c=11.72 angstroms at a temperature of 20° C. under an oxygen partial pressure of 160 Torr without having the a-axis oriented single crystalline thin film of $YBa_2Cu_3O_{7-x}$.

It will be understood from the foregoing results that unless a c-axis oriented single crystalline thin film of $YBa_2Cu_3O_{7-x}$ is formed having a lattice constant of 11.60 angstroms≦c≦11.70 angstroms at a temperature of 20° C. under an oxygen partial pressure of 160 Torr, it is not allowed to laminate an a-axis oriented single crystalline thin film of $YBa_2Cu_3O_{7-x}$ on the above film despite of employing the sputter deposition method.

Example 3

Figure 9:
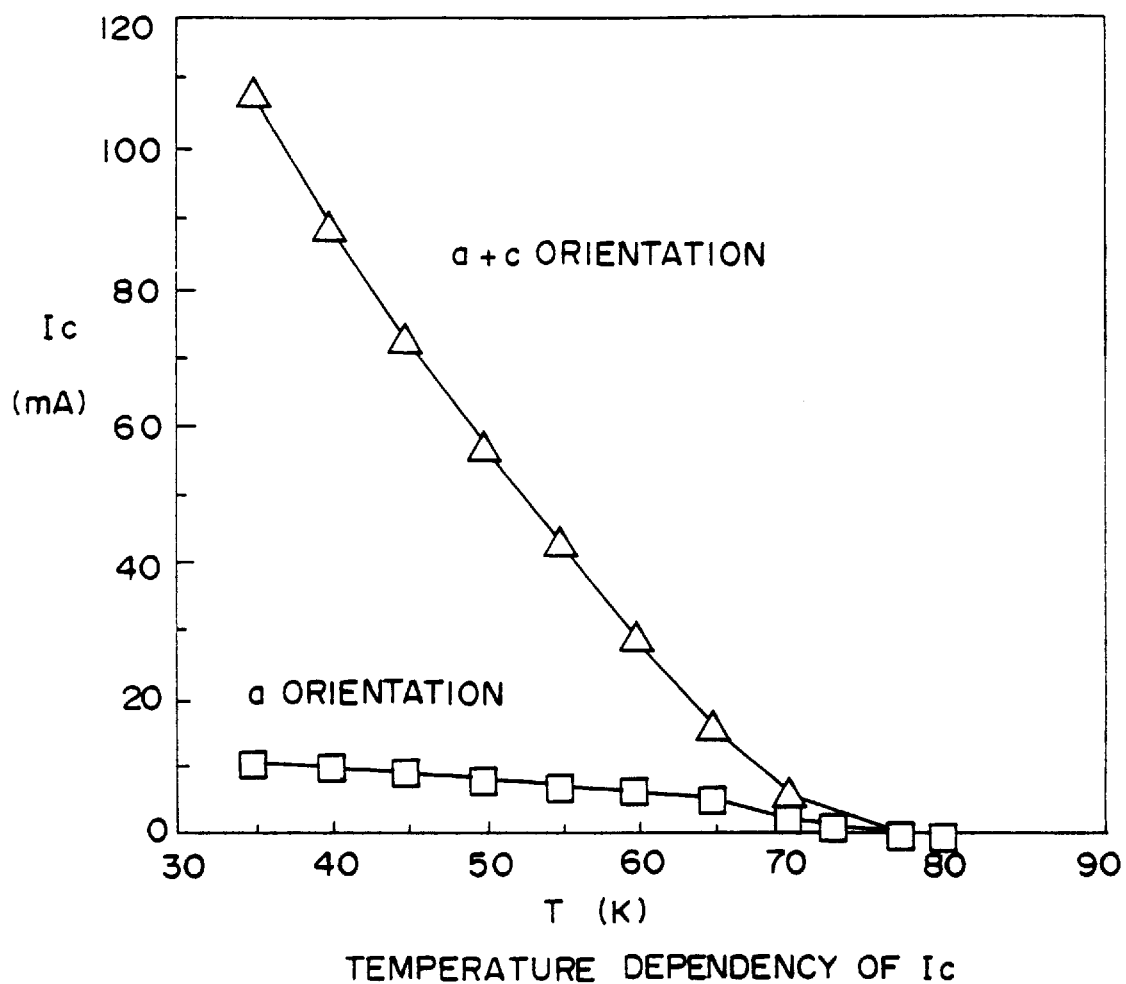
FIG. 9 is a graph in which are plotted relationships between the absolute temperature T represented by the abscissa and the critical current Ic represented by the ordinate using the laminate of a c-axis oriented single crystalline thin film and an a-axis oriented single crystalline thin film of the present invention and using the a-axis oriented single crystalline thin film.
Figure 10:
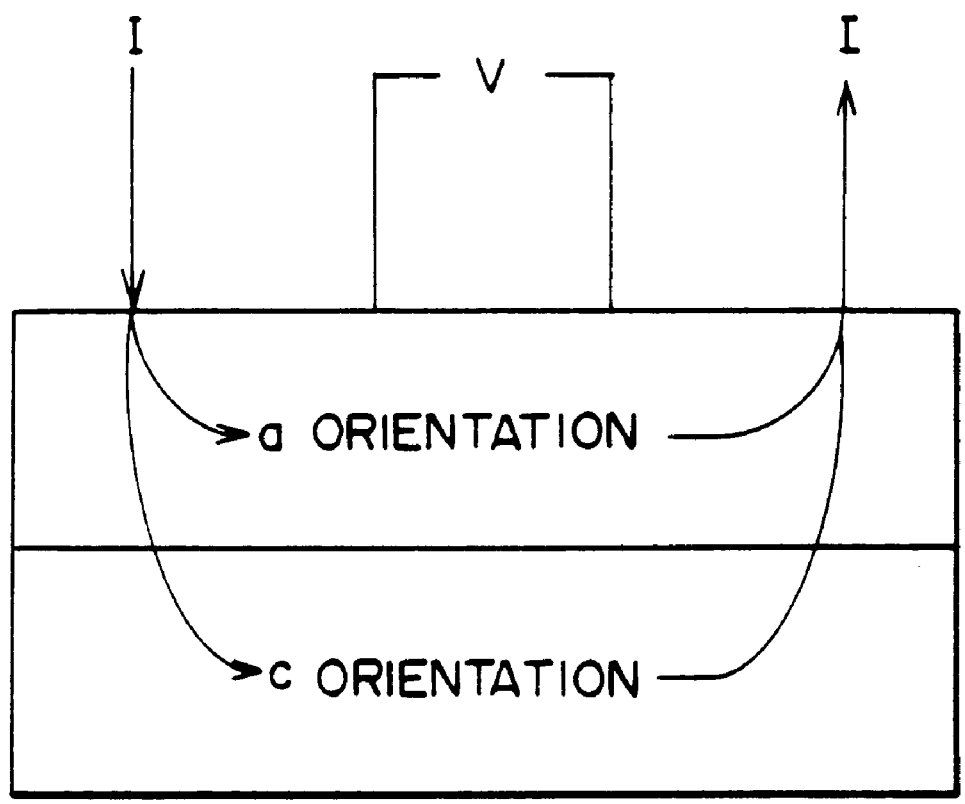
FIG. 10 is a diagram illustrating the connection of the laminate of thin films used in Example 3 to the current terminals and the flow of electric current.

The laminate of an a-axis oriented single crystalline thin film and a c-axis oriented single crystalline thin film of the 123-type copper oxide superconductor prepared in Example 2, and the a-axis oriented single crystalline thin film, were measured for their critical currents Ic in order to examine whether electrically favorable junction is formed in the interface where the a-axis oriented single crystalline thin film and the c-axis oriented single crystalline thin film are laminated. As shown in FIG. 10, current terminals were connected onto the a-axis oriented single crystalline thin film. Therefore, if electrically favorable junction is not established in the interface where the a-axis oriented single crystal thin film and the c-axis oriented single crystalline thin film are laminated, superconducting current does not flow into the c-axis oriented single crystalline thin film and Ic decreases. Here, the conditions for forming the a-axis oriented single crystalline thin film were the same as the conditions for forming the a-axis oriented single crystalline thin film of the laminate of the a-axis oriented single crystalline thin film and the c-axis oriented single crystalline thin film of Examples 1 and 2, but the thickness of the a-axis oriented single crystalline thin film was 350 nm that was the same as the thickness of the laminate of the a-axis oriented single crystalline thin film and the c-axis oriented single crystalline thin film. To measure the Ic, furthermore, a bridge of 5 μm was formed in the thin film, and Ic of the bridge was measured relying upon the DC four-terminal method. FIG. 9 shows the measured results of Ic.

From FIG. 9, the laminate of the a-axis oriented single crystalline thin film and the c-axis oriented single crystalline thin film have a very larger Ic than the a-axis oriented single crystalline thin film, and it is considered that a current is flowing even through the c-axis oriented single crystalline thin film of the laminate. From these results, it is considered that electrically favorable junction has been formed in the interface where the a-axis oriented single crystalline thin film and the c-axis oriented single crystalline thin film are laminated.

According to the present invention as described above, it was made possible to form an a-axis oriented single crystalline thin film (upper layer) of the 123-type copper oxide superconductor having different crystal axis orientation on a c-axis oriented single crystalline thin film (lower layer) of the oxide superconductor formed on the substrate by limiting the lattice constant of the thin c-axis oriented single crystal layer which is the lower layer composed of the 123-type copper oxide superconductor to lie within a predetermined range and by employing the sputter deposition method for forming the upper layer.

The laminate of the a-axis oriented single crystalline thin film and the c-axis oriented single crystalline thin film of the present invention has a very large Ic, can be used as a wiring for superconducting Josephson junctions and, particularly, as a wiring for Josephson computers, and further makes it possible to fabricate a two-terminal element and a three-terminal element utilizing strong anisotropic electric properties of the 123-type copper oxide superconductor thin film.

What is claimed is:

1. A laminate of oxide superconductor thin films of single crystalline thin films comprising a single crystalline substrate, a c-axis oriented single crystalline thin film of an oxide superconductor having the formula $YBa_2Cu_3O_{7-x}$ (x is a number of from zero to 1) formed on said substrate, and an a-axis oriented single crystalline thin film of said oxide superconductor formed on said c-axis oriented single crystalline thin film, the c-axis oriented single crystalline thin film being a single crystalline thin film having a lattice constant of 11.60 angstroms $\leq c \leq$ 11.70 angstroms at a temperature of 20° C. under an oxygen partial pressure of 160 Torr.

2. A laminate of oxide superconductor thin films according to claim 1, wherein the c-axis oriented single crystalline thin film has a thickness of from 1 to 1000 nm and the a-axis oriented single crystalline thin film has a thickness of from 1 to 1000 nm.

3. A laminate of oxide superconductor thin films according to claim 1, wherein said single crystalline substrate is an $SrTiO_3$ (100) single crystalline substrate.

4. A wiring for Josephson junction comprising a laminate of oxide superconductor thin films of claim 1.

\* \* \* \* \*

UNITED STATES PATENT AND TRADEMARK OFFICE
CERTIFICATE OF CORRECTION

PATENT NO : 6,074,768
DATED : June 13, 2000
INVENTOR(S): Yoshinori MATSUNAGA; Shuichi FUJINO; Akihiro ODAGAWA; Youichi ENOMOTO, all of Tokyo, Japan It is certified that error appears in the above-identified patent and that said Letters Patent are hereby corrected as shown below:

Col. 1, line 73, change "Kyocera Corporation, Tokyo, Japan" to
–KYOCERA CORPORATION, INTERNATIONAL SUPERCONDUCTIVITY TECHNOLOGY CENTER and MATSUSHITA ELECTRIC INDUSTRIAL CO., LTD., all of Japan–.

Signed and Sealed this

Twenty-second Day of May, 2001

*Attest:*

NICHOLAS P. GODICI

*Attesting Officer*   *Acting Director of the United States Patent and Trademark Office*